US008598748B2

(12) United States Patent
Howe

(10) Patent No.: US 8,598,748 B2
(45) Date of Patent: Dec. 3, 2013

(54) ROLLER SPARK GAP

(75) Inventor: Varce E. Howe, Zionsville, IN (US)

(73) Assignee: Xtreme ADS Limited, Anderson, IN (US)

( * ) Notice: Subject to any disclaimer, the term of this patent is extended or adjusted under 35 U.S.C. 154(b) by 564 days.

(21) Appl. No.: 12/676,494

(22) PCT Filed: Sep. 11, 2008

(86) PCT No.: PCT/US2008/076004
§ 371 (c)(1), (2), (4) Date: Mar. 4, 2010

(87) PCT Pub. No.: WO2009/036163
PCT Pub. Date: Mar. 19, 2009

(65) Prior Publication Data

US 2010/0207459 A1 Aug. 19, 2010

Related U.S. Application Data

(60) Provisional application No. 60/971,342, filed on Sep. 11, 2007.

(51) Int. Cl.
*H03K 3/00* (2006.01)
*H03K 3/64* (2006.01)

(52) U.S. Cl.
USPC .......... 307/106

(58) Field of Classification Search
None
See application file for complete search history.

(56) References Cited

U.S. PATENT DOCUMENTS

| | | | | |
|---|---|---|---|---|
| 2,879,218 | A | 3/1959 | Stirnemann et al. | |
| 3,099,814 | A * | 7/1963 | Lawrence et al. | 367/68 |
| 3,146,336 | A * | 8/1964 | Whitacre | 219/121.59 |
| 4,223,279 | A | 9/1980 | Bradford, Jr. et al. | |
| 4,236,062 | A * | 11/1980 | Lilly et al. | 219/384 |
| 5,354,963 | A * | 10/1994 | Muller et al. | 219/121.54 |
| 5,852,267 | A * | 12/1998 | Yanobu | 219/68 |
| 6,099,667 | A * | 8/2000 | Vanden Brande et al. | 148/565 |
| 6,254,764 | B1 | 7/2001 | Babington et al. | |
| 6,913,183 | B2 | 7/2005 | Becker et al. | |
| 2002/0105773 | A1* | 8/2002 | Seely et al. | 361/263 |
| 2002/0109470 | A1* | 8/2002 | Hammen et al. | 315/363 |

FOREIGN PATENT DOCUMENTS

| | | |
|---|---|---|
| JP | 2001-135451 | 5/2001 |
| JP | 2003-020206 | 1/2003 |
| JP | 2003-203744 | 7/2003 |

OTHER PUBLICATIONS

Notification of Transmittal of The International Search Report and The Written Opinion of the International Searching Authority received in PCT/US2008/07, Apr. 24, 2009.

* cited by examiner

*Primary Examiner* — Carlos Amaya
(74) *Attorney, Agent, or Firm* — Woodard, Emhardt, Moriarty, McNett & Henry LLP

(57) ABSTRACT

Disclosed are an apparatus, system and method for switching high voltage currents using a roller shaped electrode arranged with another electrode to create a spark gap.

32 Claims, 10 Drawing Sheets

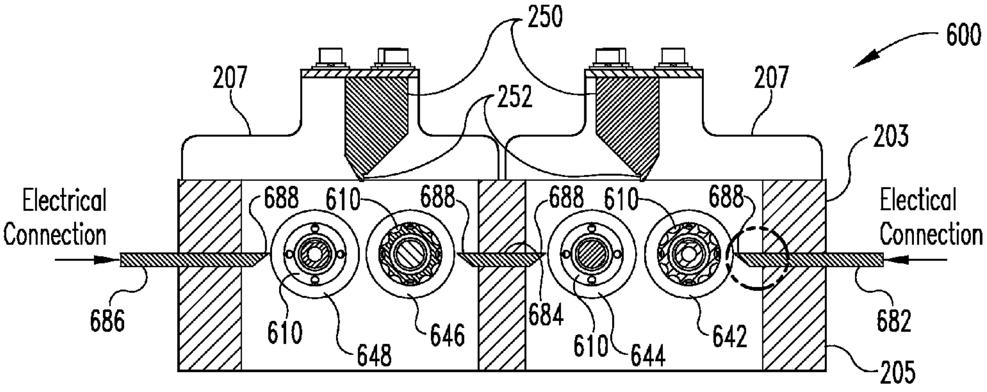
Fig. 13
Fig. 13A
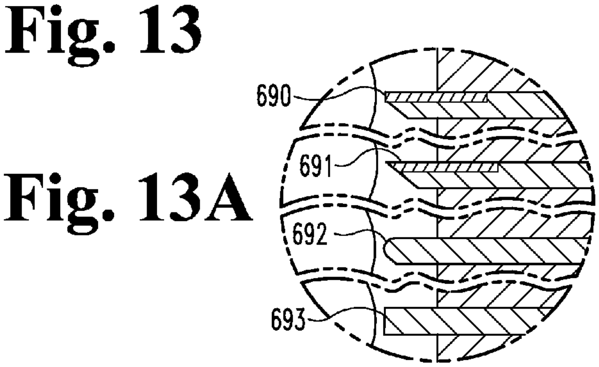
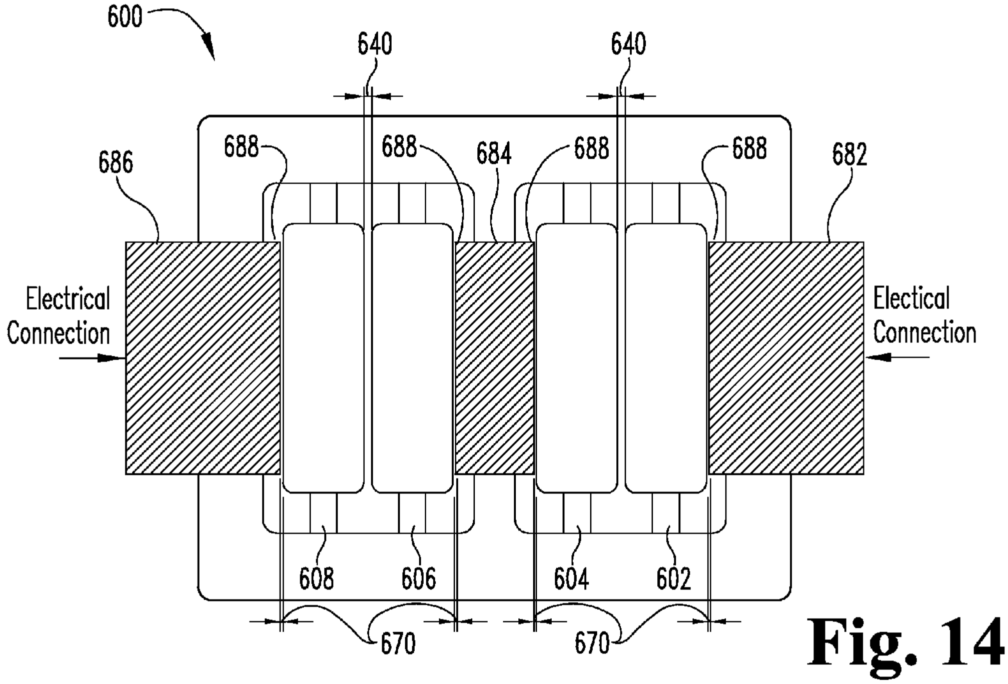
Fig. 14

ROLLER SPARK GAP

CROSS-REFERENCE TO RELATED APPLICATIONS

The present application is a national stage application of International Patent Application No. PCT/US2008/076004 filed Sep. 11, 2008, which claims the benefit of U.S. Provisional Application No. 60/971,342 filed Sep. 11, 2007, both of which are hereby incorporated by reference in their entirety.

BACKGROUND

The present disclosure is related to a spark gap for switching high voltage currents for pulsed power applications.

A spark gap generally consists of an arrangement of two conducting electrodes separated by a gap usually filled with a dielectric gas such as air. When a suitable voltage is supplied across the electrodes, an "avalanche" effect occurs where the electric field between the electrodes ionizes some of the dielectric gas between the electrodes. The ionized gas then conducts a small amount of electricity that heats and further ionizes the gas until the ionized gas becomes a good conductor of electricity, drastically reducing its electrical resistance and heating the dielectric gas, creating plasma between the electrodes. Subsequent current flow through the ionized gas can maintain the conductive channel and keeps the gas heated. The electric current flows until the path of ionized gas is broken or the current reduces below a minimum value so the gas cools and stops conducting.

There are several known techniques for quenching an established arc. One method used is to expend the arc out over a series of gaps (connected in series). By connecting the gaps in series, the voltage drop across an individual gap is reduced. Adding additional gaps in series further lowers the voltage differential at each gap. Once voltage differential drops to a point where the arc is no longer self sustaining, the arc breaks without removing the ionized gas.

A second type of quenching uses flowing air (or other dielectric gas) to disrupt the ionized gas between electrodes. This removes the hot ions from between the electrodes and physically disrupts the established arc but does not alter the electric field between the electrodes.

A third type of quenching is magnetically quenching the gap. Placing a strong magnetic field between the electrodes alters the field formed by the high voltage across the electrodes. This breaks the arc without removing the ionized gas.

A fourth type of quenching is to increase the spark gap. For example, a rotary spark gap consisting of a revolving dielectric disk with electrodes spaced about the rim. The disk is mounted and spun between stationary electrodes. As a moving electrode passes between the stationary electrodes, the gap fires (if there is sufficient voltage potential). As the electrode moves away, the spark gap increases, stretching and breaking the arc. The movement of the disk and the electrode (s) can also serve to disrupt the ionized gas path. The rate the moving electrodes pass between the stationary electrodes can control the rate the gap fires.

There are also several techniques to trigger a spark gap. Triggered spark gaps may include electrodes spaced far enough apart that spontaneous breakdown does not occur without initiating energy. By way of example only, initiating energy could be in the form of UV irradiation from a laser or another spark to heat and ionize the gas between the electrodes. Or the initiating energy could be an over-voltage pulse. Another example method is to vary the gas pressure of the dielectric gas to alter the required breakdown voltage for a particular electrode gap. A rotary spark gap is another example of a triggered spark gap.

Spark gaps can be used to control various resonant circuits, for example, Tesla coils, Oudin Coils and Marx generator circuits. In such systems, the spark gap can operate as a switch to discharge a tank circuit capacitance to the resonant circuit.

Spark gaps can also be used to switch high voltages and high currents for certain pulsed power applications, such as pulsed lasers, pulsed radar, rail-guns, fusion and pulsed magnetic field generators.

Spark gaps can also be used to prevent voltage surges from damaging equipment. For example, spark gaps are used in high-voltage switches. Spark gaps can also be used to protect sensitive electrical or electronic equipment from high voltage surges.

BRIEF DESCRIPTION OF THE DRAWINGS

FIG. 13 is a side cross-sectional view of an alternate embodiment of a spark gap apparatus.

FIG. 13*a* is an enlarged view of the encircled partial view of FIG. 13 illustrating four separate embodiments of tip 688.

FIG. 14 is a top cross-sectional view of the FIG. 13 apparatus.

DETAILED DESCRIPTION OF THE DRAWINGS

Figure 1:
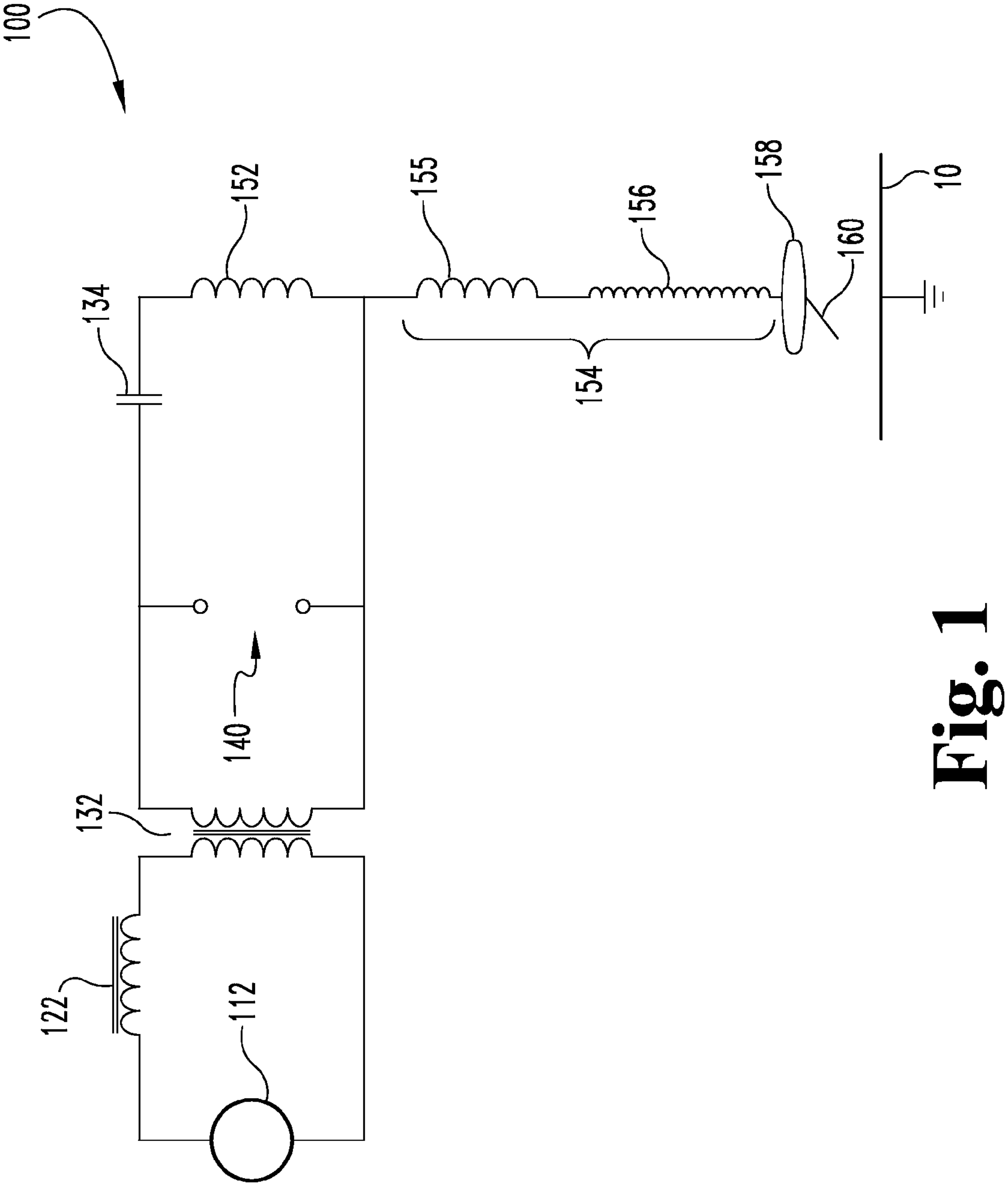
FIG. 1 is a simplified electrical schematic of system 100.

For the purpose of promoting an understanding of the disclosure, reference will now be made to certain embodiments thereof and specific language will be used to describe the same. It will nevertheless be understood that no limitation of the scope of this disclosure is thereby intended, such alterations, further modifications and further applications of the principles described herein being contemplated as would normally occur to one skilled in the art to which the disclosure relates. In several figures, where there are the same or similar elements, those elements are designated with similar reference numerals.

Referring to FIG. 1, system 100 illustrates a simplified schematic of a system utilizing a spark gap. System 100 includes AC generator 112, reactive ballast 122, transformer 132, capacitor 134, spark gap 140, primary coil 152; secondary coil 154 comprising magnifier windings 155 and resonator windings 156 coupled to toroidal capacitor 158 and emitter 160. Emitter 160 being positioned over and away from ground 10. In various embodiments, spark gap 140 is a roller spark gap as disclosed below.

System 100 illustrated in FIG. 1 operates as follows. AC generator 112 provides a 240 V alternating current at 60 Hz that is coupled to transformer 132 through reactive ballast 122. Transformer 132 is a standard step down distribution transformer primarily used to convert 14,400 V to standard 240 V such as those used in neighborhood localities. In the illustrated embodiment, this step down distribution transformer is wired backwards so that it becomes a step up transformer such that the 240 V coming from AC generator 112 is increased to 14,400 V. The output of transformer 132 is coupled to primary coil 154 through spark gap 140 and capacitor 134. When powered by AC generator 112, electric potential accumulates in capacitor 134 until sufficient potential is reached to overcome the dielectric gap between the electrodes of spark gap 140. Once sufficient potential is accumulated, break over occurs and a spark jumps between the electrodes of spark gap 140 and the energy stored in capacitor 134 is released into primary coil 152 through spark gap 140. Primary coil 152 is electromagnetically coupled to secondary coil 154 by magnifier windings 155 and resonator windings 156 further multiply the voltage transferred from primary coil 152 to secondary coil 154 to toroidal capacitor 158 where the charge accumulates until sufficient potential is reached to overcome the air gap between emitter 160 and ground 10 at which point an electric discharge between emitter 160 and ground 10 discharges the stored potential. Other embodiments may optionally omit magnifier windings 155.

It should be understood that the various embodiments of a roller spark gap disclosed herein can be used in other systems calling for a spark gap and that system 100 is but a representative embodiment of a system in which a roller spark gap could be utilized. As discussed in the background section, spark gaps can be utilized in a wide variety of applications and the roller spark gap disclosed herein can be substituted for other types of high voltage switches in these other applications.

Figure 2:
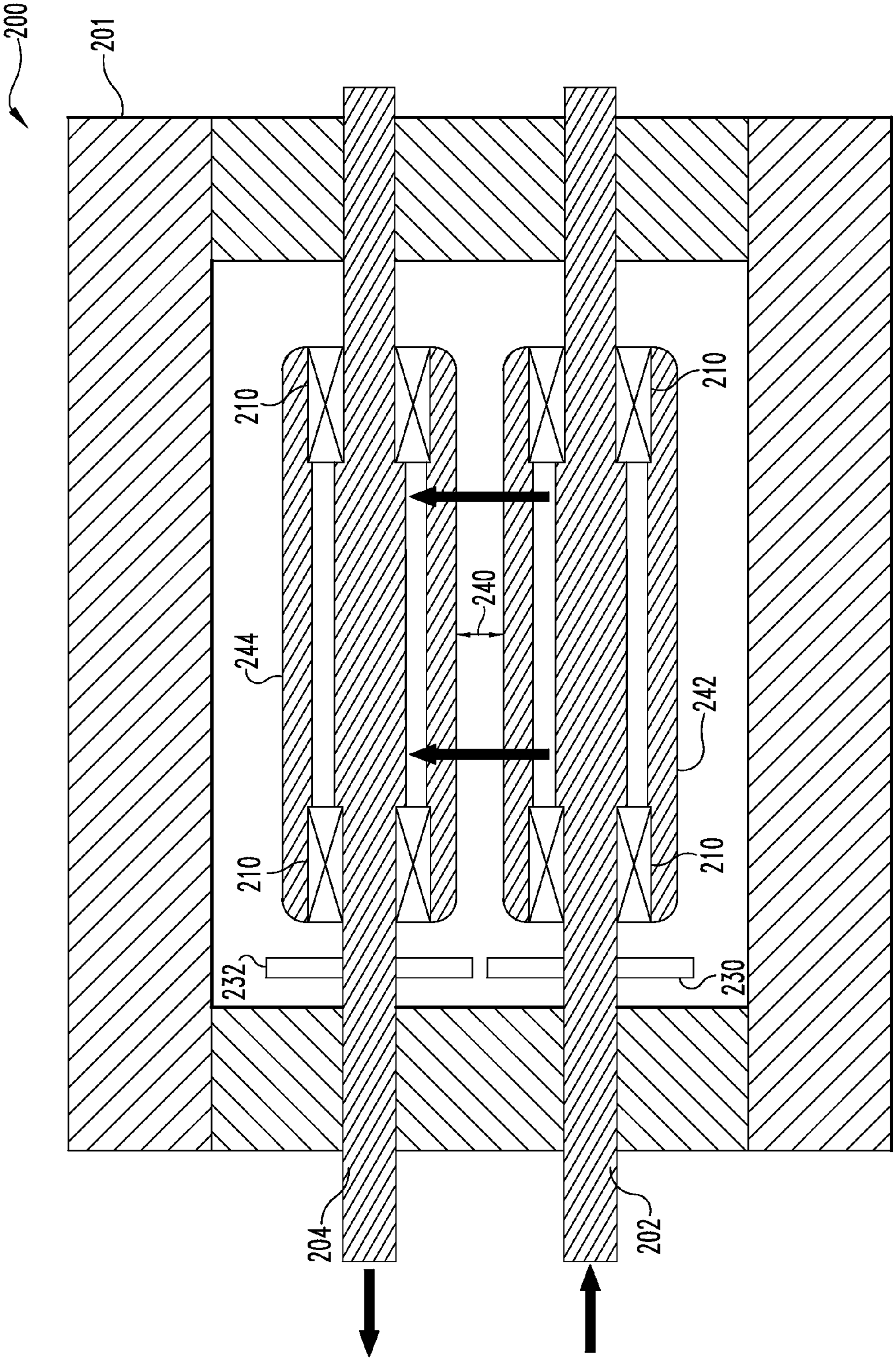
FIG. 2 is a top down cross-sectional view of a spark gap apparatus.
Figure 3:
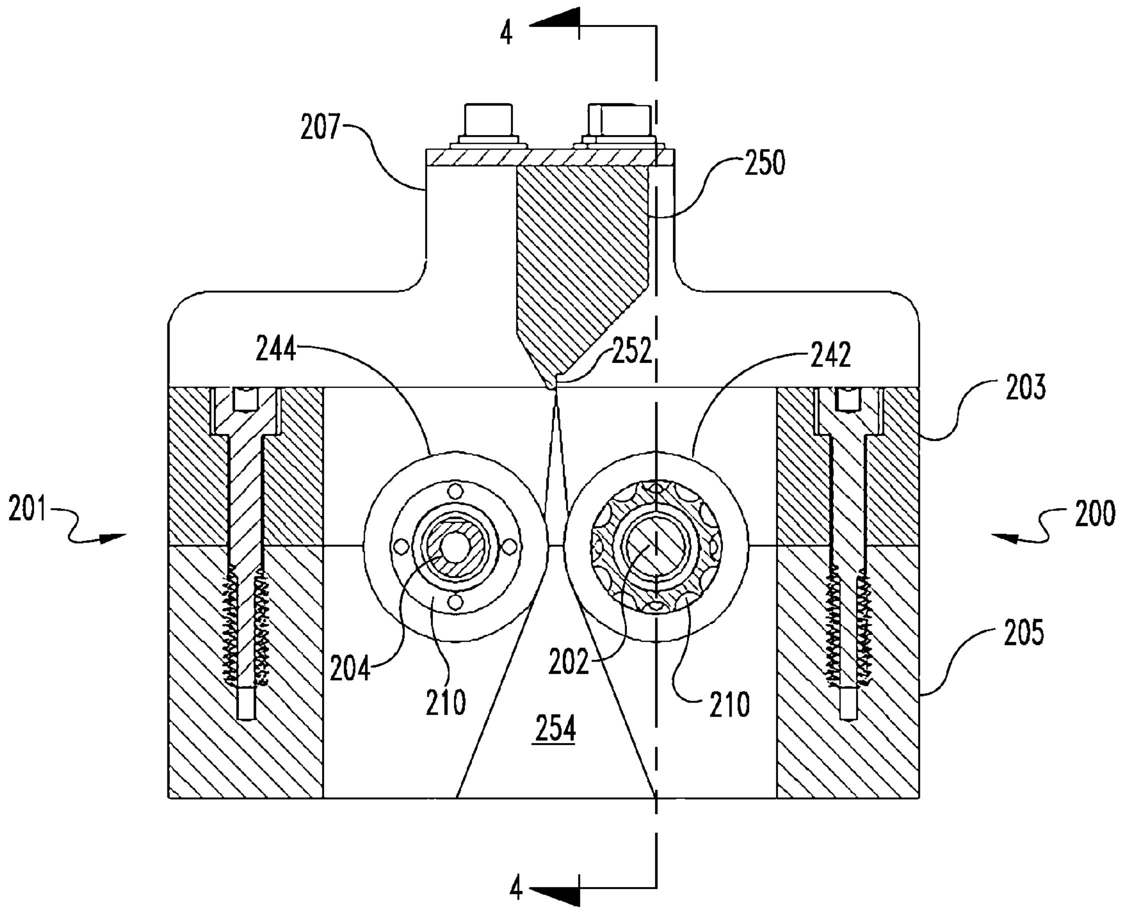
FIG. 3 is a cross-sectional side view of the apparatus of FIG. 2.

Referring to FIGS. 2-3, an embodiment of spark gap 140 is illustrated as assembly 200. Specifically regarding FIG. 2, assembly 200 is a roller spark gap that includes casing 201, shafts 202 and 204, and bearings 210 mounting rollers 242 and 244 on shafts 202 and 204. Shafts 202 and 204 include pulleys 230 and 232 and rollers 242 and 244 are set apart by roller gap 240. The arrows illustrated on FIG. 2 depict current flow from shaft 202 to shaft 204 through roller gap 240, roller 242 and 244 and bearings 210.

The physical size of the rollers 242 and 244 are related to the anticipated power throughput for rollers 242 and 244. Larger rollers are heavier, require more material and may have more erratic firing behavior, possibly due to more variation in the electric field strength at any point along the roller. Rollers also have a capacitance that could affect the circuit being controlled. Larger diameter rollers may have an increased affect as compared to smaller diameter rollers. Roller diameters between approximately 0.5 and 3.0-inches have been found to be appropriate for roller spark gaps handling between 8 and 12 kW. Similarly, longer or shorter roller could be used for other embodiments. Longer rollers generally require proportionally more airflow for the same quenching.

In one embodiment utilizing a single gap, the rollers illustrated in FIGS. 2-3 have a roller diameter between approximately 1.5 to 2.5-inches and a roller length between approximately 6 to 10 inches with roller gap 240 being set between approximately 0.16 to 0.26 inches producing an air breakdown voltage between approximately 10 to 14.4 kV rms. This embodiment utilizes a high pressure air supply operating between approximately 20 scfm at 40 psi and 33 scfm at 100 psi through air knives 250. This embodiment can handle between approximately 8 to 12 kW of power for over 80 hours of continuous operation at 300 gap-firings per second, (over 86 million cycles).

Referring to FIG. 3, assembly 200 is illustrated in a side view and includes top support 203, bottom support 205, bracket 207 mounting air knife 250 having air output 252 which generate airflow 254 between rollers 242 and 244.

As depicted in FIGS. 2-3, rollers 242 and 244 are oriented parallel to each other to produce a substantially uniform roller gap 240. Rollers 242 and 244 can rotate about shafts 202 and 204 on internal bearings 210. Shafts 202 and 204 can be electrically connected to a circuit such as system 100. Rollers 242 and 244 serve as spark gap electrodes. Roller gap 240 is set such that the electrical conduction and hence breakdown voltage between rollers 242 and 244 occurs at a desired applied high voltage differential between rollers 242 and 244. Air knife 250 produces airflow 254 that is substantially perpendicular to roller gap 240 to quench roller gap 240 after each discharge. Airflow 254 may also remove heat from rollers 242 and 244 if airflow 254 is at a lower temperature than rollers 242 and 244.

Rollers 242 and 244 can be rotated during operation by a belt (not illustrated) driving pulleys 230 and 232. In alternate embodiments, pulleys 230 and 232 can use timing belts or o-ring belts depending on the degree of accuracy and synchronization desired between rotation of rollers 242 and 244. In other embodiments, pulleys 230 and 232 may be replaced with intermeshing gears. In yet other embodiments, pulleys 230 and 232 may be omitted, in such embodiments; pulleys 230 and 232 may be replaced with a turbine wheel that can convert airflow 254 to rotation of rollers 242 and 244. And yet in other embodiments, rollers 242 and 244 may be left to rotate in airflow 254, unaided in any other way.

Assembly 200 may also include additional roller pairs with associated roller gaps electrically added in series or in parallel. In embodiments adding additional gaps in series, the gap spacing for each opposing roller pair may need to be reduced such that the total cumulative spacing for the required breakdown voltage remains the same. Gap spacing establishes the repetition rate of discharges as well as the average power delivered by an individual discharge.

In some embodiments, rollers 242 and 244 are substantially concentric about shaft 202 and 204. In other embodiments either or both of rollers 242 and 244 are non-concentric such that roller gap 240 varies to some degree with the revolution of rollers 242 and/or 244. In alternative embodiments, non-concentric rollers 242 and 244 are rotated together with a timing belt to control roller gap 240 in a predictable manner.

Charging circuits, such as the one illustrated in FIG. 1, may include a constant power source and a corresponding constant charge rate. Use of a spark gap such as the roller spark gap disclosed herein to control the discharge of a constant charge rate circuit means the discharge repetition rate and the average delivered power are established by the break over voltage for a particular configuration of the spark gap.

Figure 4:
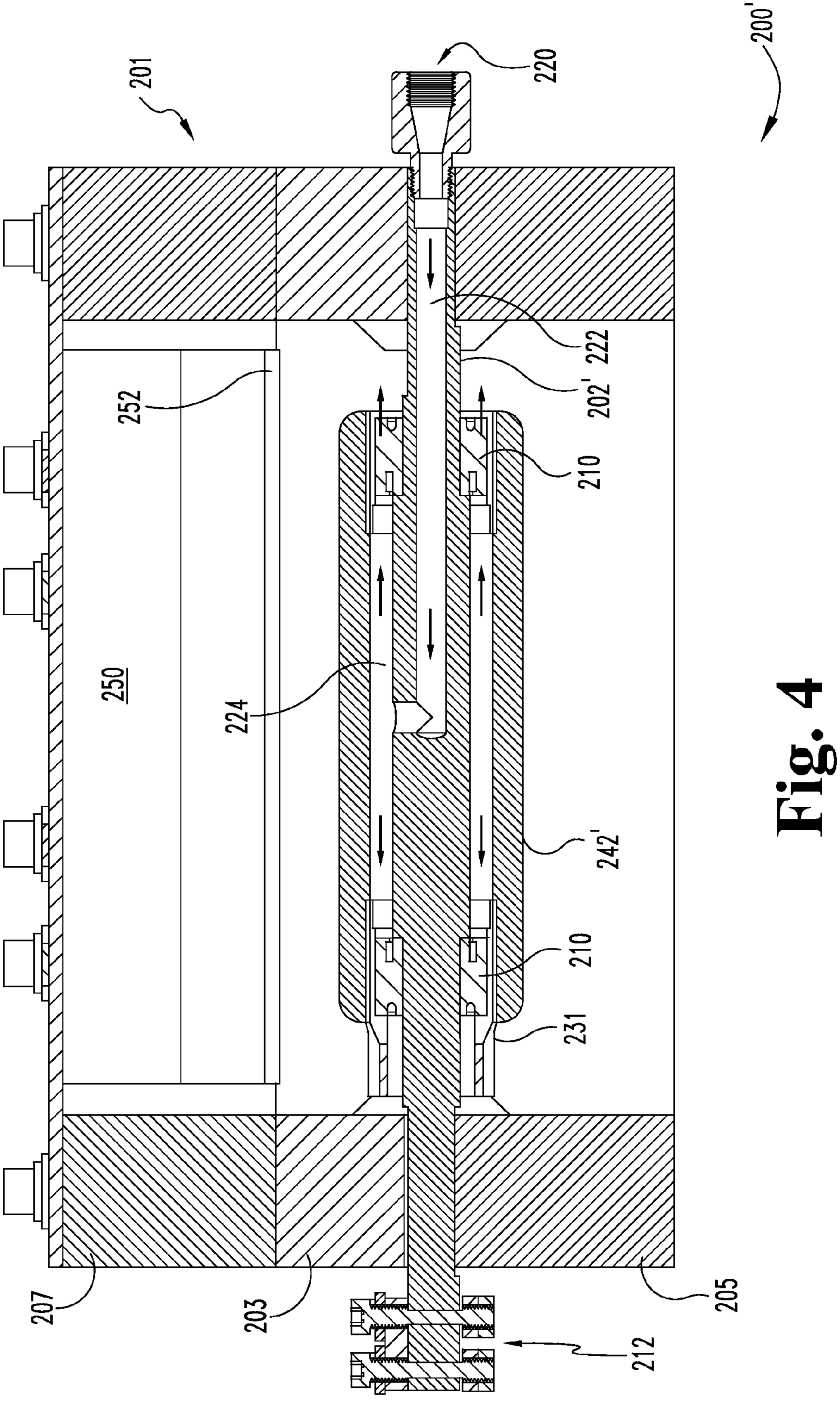
FIG. 4 is a cross-sectional side view of an alternate embodiment of the FIG. 2 apparatus along section line 4-4.

Referring to FIG. 4, an alternative embodiment of assembly 200 is illustrated as assembly 200'. Assembly 200' includes modified roller 242' and modified roller 244' (not illustrated). As illustrated, roller 242' includes air input 220 coupled to passage 222 in shaft 202'. Passage 222 connects air input 220 to internal space 224 located between roller 242' and shaft 202'. Coupling air input 220 to a source of pressurized air (or other dielectric gas) provides air flow as indicated by arrows in FIG. 4.

Roller 242' also includes electrical contact 212 and turbine wheel 231. As described above, turbine wheel 231 is an alternative to drive pulley 230. Turbine wheel 231 can be configured to be driven by the air flow coming through roller 242' from air input 220 or alternatively can be configured to be driven by air flow 254 from air knife 250.

Figure 5:
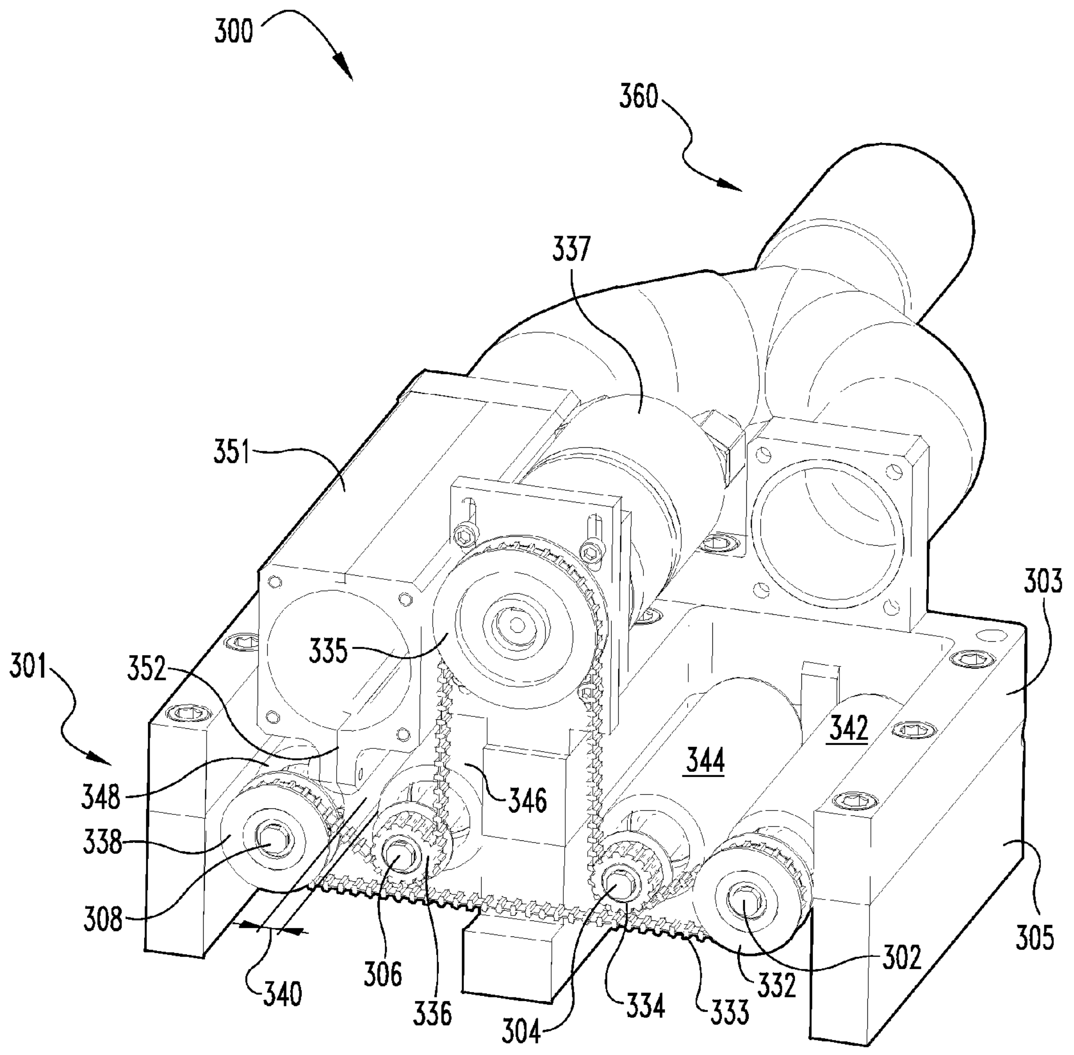
FIG. 5 is a partial perspective view of a spark gap apparatus with section cut away.
Figure 6:
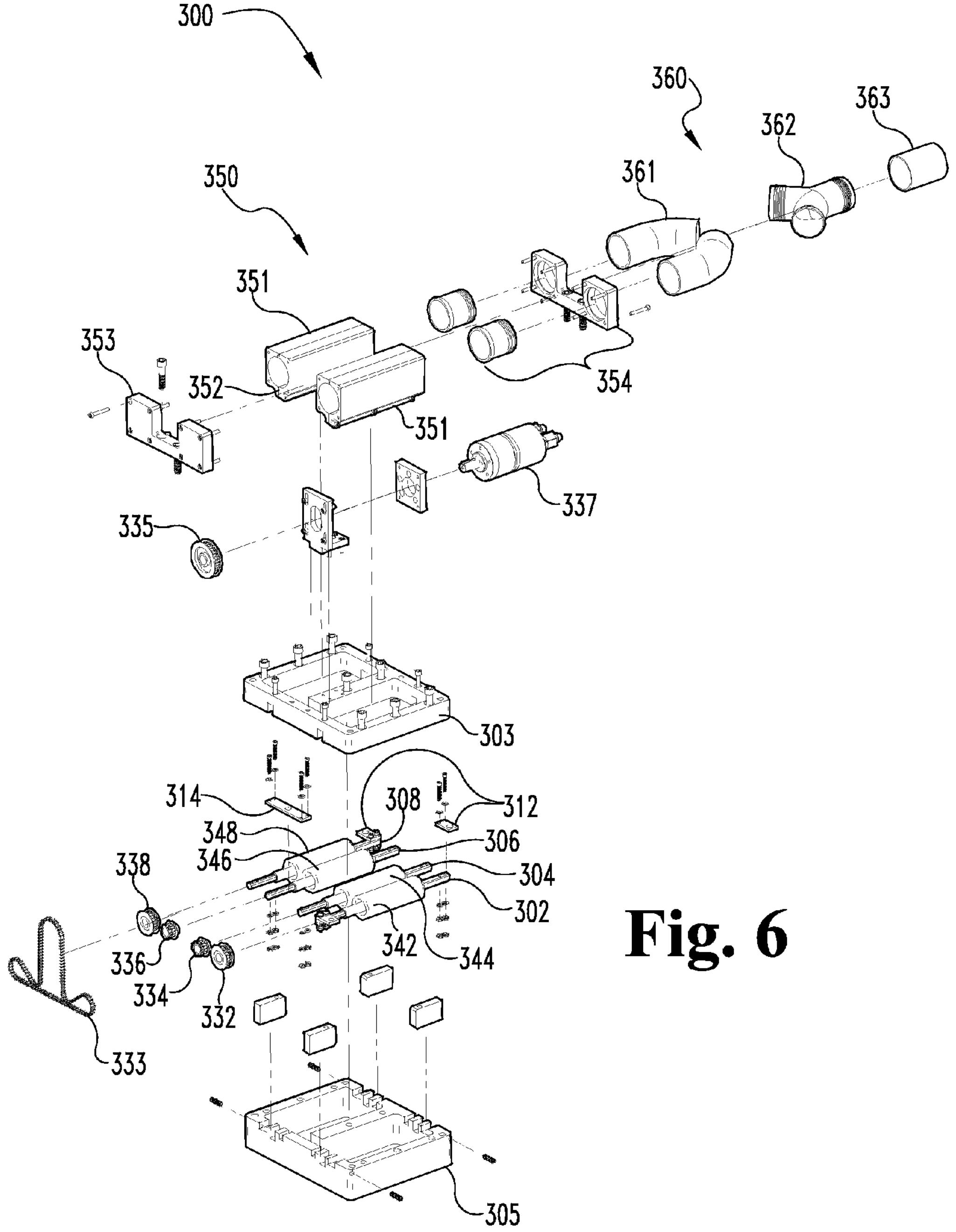
FIG. 6 is a perspective assembly view of the apparatus of FIG. 5.

Referring to FIGS. 5-6, another embodiment of a roller spark gap is illustrated as assembly 300. Assembly 300 includes casing 301 comprising top support 303 and bottom support 305 with rollers 342, 344, 346 and 348 mounted on shafts 302, 304, 306 and 308. Shafts 302, 304, 306 and 308 include pulleys 332, 334, 336 and 338. Rollers 342 and 344 are set apart by roller gap 340 and rollers 346 and 348 are also set apart by the same roller gap 340. Shafts 304 and 308 are electrically coupled together by contact bar 314 and shafts 302 and 308 include electrical contacts 312. Configured in this way, spark gaps 340 are in series. Other embodiments provide for connecting spark gaps 340 in parallel.

Pulleys 332, 334, 336 and 338 are coupled to pulley 335 by belt 333. Pulley 335 is coupled to motor 337 that drives rotation. As illustrated, pulleys 334 and 336 are smaller than pulleys 332 and 338. This provides differential rotation speeds between rollers 342 and 344 and rollers 346 and 348. In alternative embodiments, pulleys 332, 334, 336 and 338 can be the same size so that rollers 342, 344, 346 and 348 rotate at the same speed.

Assembly 300 also includes two air knives 350. Air knives 350 include air manifolds 351 with end caps 353 and hose brackets 354 coupled to air hoses 360. Air hoses 360 comprise hose sections 361, Y-connector 362 and supply line 363 coupled to a source of high velocity air or other dielectric gas (not illustrated). Air knives 350 are coupled to assembly 300 at end caps 353 and hose bracket 354 that connect to top support 303. Air manifolds 351 include output slots 352 that direct airflow towards roller gaps 340.

In one embodiment utilizing two gaps in series, rollers 342, 344, 346 and 348 each have a roller diameter between approximately 1.0 to 2.5-inches and a roller length between approximately 4 to 6-inches with roller gaps 340 set between approximately 0.08 to 0.14-inches (total gap between approximately 0.17 to 0.28-inches) producing an air breakdown voltage between approximately 10 to 14.4 kV rms. This embodiment utilizes a high velocity air supply operating between approximately 80 scfm at 1.0 psi and 65 scfm at 1.5 psi through air knives 350. This embodiment can handle between approximately 8 to 12 kW of power for over 80 hours of continuous operation at 300 gap-firings per second, (over 86 million cycles).

In another embodiment utilizing two gaps in series, rollers 342, 344, 346 and 348 each have an approximate roller diameter of 1.5-inches and a roller length of approximately 5-inches with roller gaps 340 set at approximately 0.100-inches (total gap of approximately 0.200-inches) producing an air breakdown voltage of approximately 12 kV rms. This embodiment utilizes a high velocity air supply operating between approximately 80 scfm at 1.0 psi and 65 scfm at 1.5 psi through air knives 350. This embodiment can handle between approximately 8 to 12 kW of power for over 80 hours of continuous operation at 300 gap-firings per second, (exceeding 86 million shot life).

Figure 7:
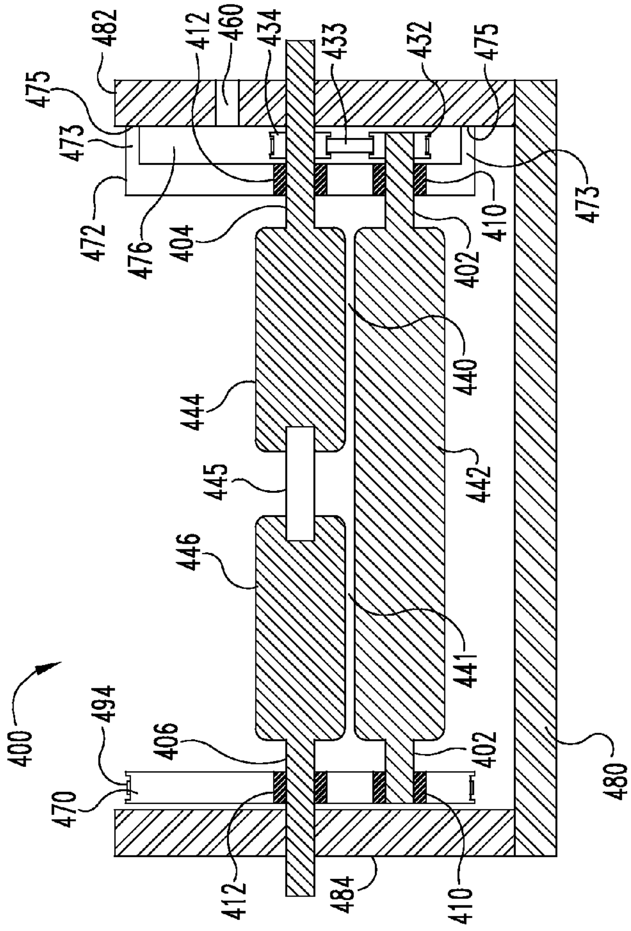
FIG. 7 is a side cross-sectional view of an alternate embodiment of a spark gap apparatus.
Figure 8:
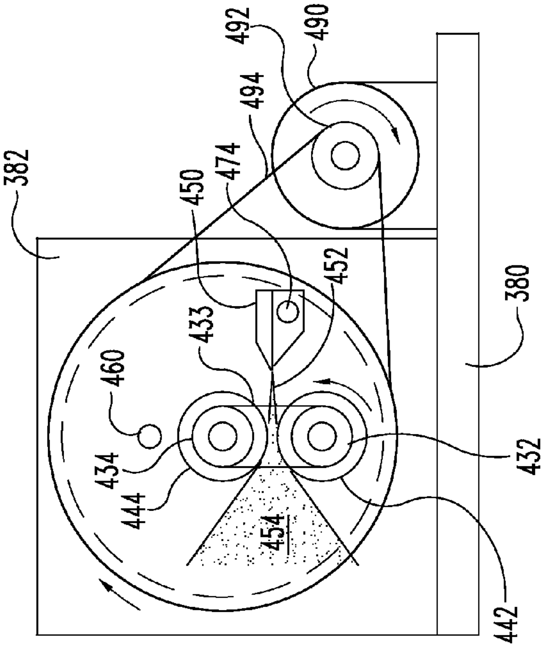
FIG. 8 is a right side view of the FIG. 7 apparatus.

Referring to FIGS. 7-8, an alternative embodiment of a roller spark gap is illustrated as assembly 400. Assembly 400 includes rollers 444 and 446 separated by insulator 445 and roller 442. Roller 442 includes stubs 402 on either side and roller 444 includes stub 404 and roller 446 includes stub 406. Rollers 442, 444 and 446 are mounted in disks 470 and 472 by bearings 410 and 412 through which stubs 402, 404 and 406 pass. Rollers 442 and 446 are spaced apart from roller 442 by roller gaps 440 and 441.

Stubs 404 and 406 are connected to supports 482 and 484 which are both connected to base 480. Rollers 444 and 446 do not rotate but roller 442 rotates about rollers 444 and 446 on disks 470 and 472. Stub 404 is rotationally coupled to stub 402 through pulleys 434 and 432 connected by belt 433. In an alternative embodiment, stub 402 can be rotationally coupled to stub 404 through an intermeshed gear system.

Assembly 400 also includes air knife 450 with air output 452 producing air flow 454 through gaps 440 and 441. Air knife 450 is coupled to manifold 476 between disk 472 and support 482 by air supply 474 that passes through disk 472. Manifold 476 is also coupled to air supply 460. Air supply 460 is coupled to an external source of pressurized air or other dielectric gas (not illustrated).

Disk 470 is coupled to motor 490 by belt 494 passing over pulley 492 that is coupled to the output of motor 490.

Manifold 476 is defined by disk 472, support 482 and flange 473 that extends between disk 472 and support 482. Flange 473 contacts support 482 at rotating seal 475. Rotating seal 475 can be any form known in the art.

As illustrated in FIG. 8, roller 442 rotates about roller 444 and 446 through the rotation of disks 470 and 472. Similarly, air knife 450 also rotates about rollers 444 and 446 with air output 452 oriented towards spark gaps 440 and 441.

Figure 9:
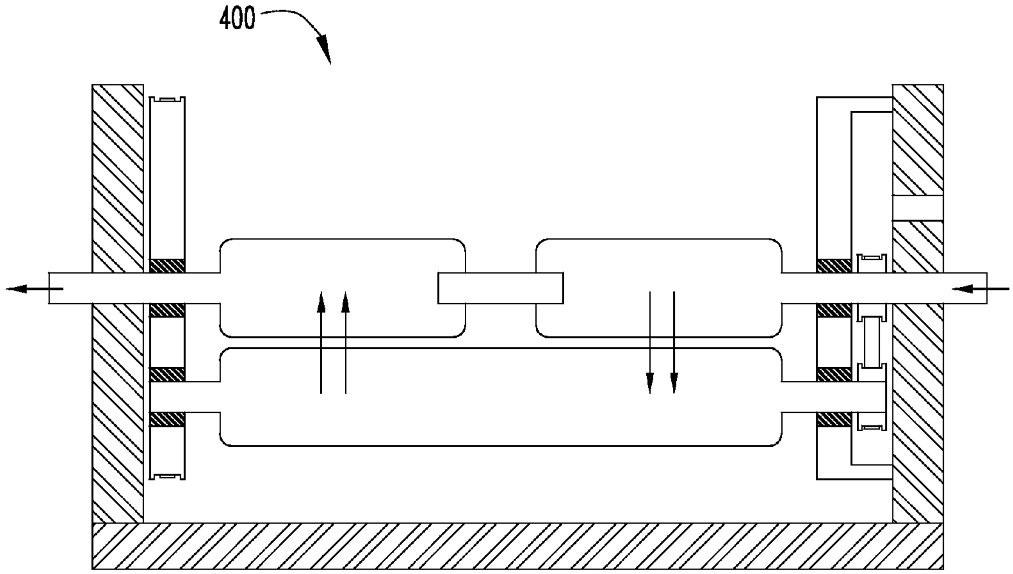
FIG. 9 is a front side view of the FIG. 7 apparatus.

Referring to FIG. 9, electric current passes through rollers 442, 444 and 446 as illustrated with arrows crossing spark gaps 440 and 441.

Figure 10:
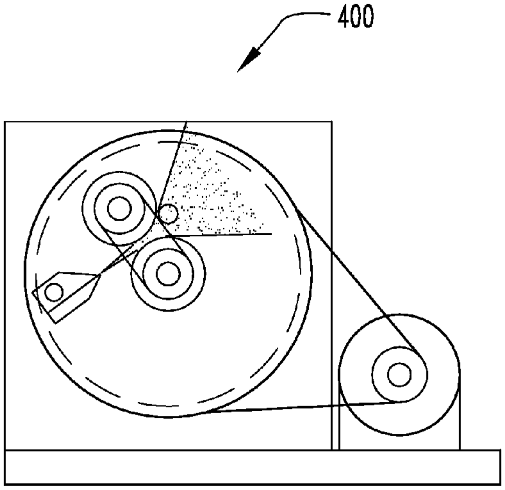
FIG. 10 is a right side view of the FIG. 8 apparatus in a different rotational position.
Figure 11:
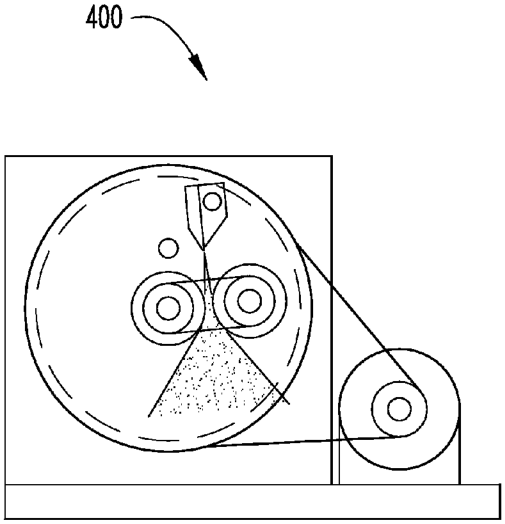
FIG. 11 is a right side view of the FIG. 8 apparatus in a different rotational position from FIGS. 8 and 10.

Turning to FIGS. 10-11, assembly 400 is illustrated in the side view at various points along the rotation of disks of 470 and 472 illustrating the orientation of rollers 442, 444, 446 and air knife 450 and air flow 454 and alternative points in the rotational disks 470 and 472.

Figure 12:
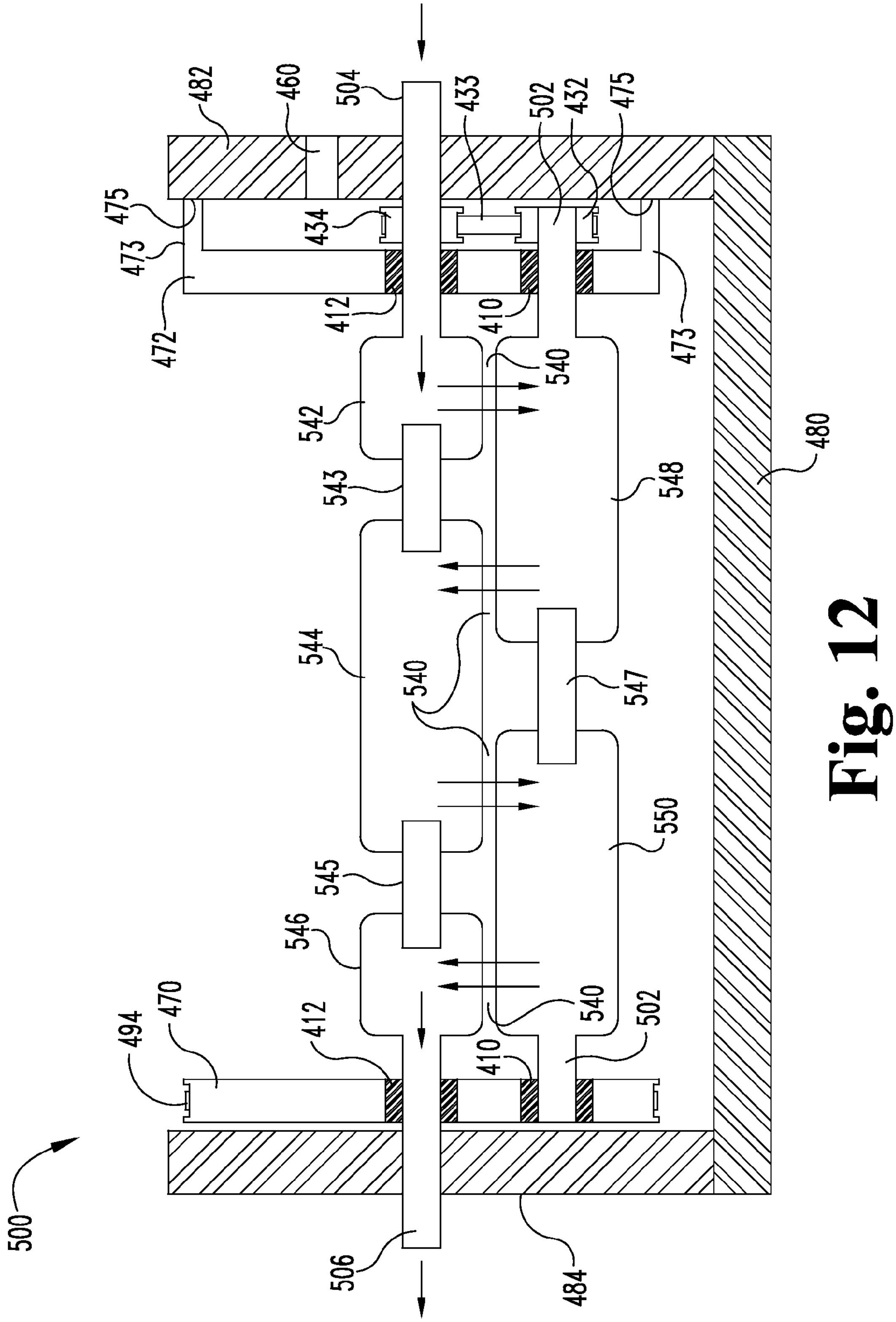
FIG. 12 is a front side cross-sectional view of an alternative embodiment of the FIG. 7 apparatus.

Referring to FIG. 12, an alternative embodiment of a roller spark gap is illustrated as assembly 500. Assembly 500 shares many common components with assembly 400. Common components with the same reference numeral have the same function or characteristics in assembly 500 as they did in assembly 400 and are not repeated.

Assembly 500 includes rollers 542, 544 and 546 separated by insulators 543 and 545 and having stubs 504 coupled to support 482 and stub 506 coupled to support 484. Assembly 500 also includes rollers 548 and 550 coupled by insulator 547 with roller 548 and 550 being connected to stubs 502.

Arrows indicate path of current through assembly 500 with the supply being connected to stub 504 passing to roller 542, jumping gap 540 to roller 548 which then again jumps second gap 540 to roller 544 again jumps gap 540 to roller 550 and again jumps gap 540 to roller 546 and exits assembly 500 through stub 506. As illustrated, assembly 500 includes four spark gaps 540 in series.

Rollers 542, 544 and 546 are separated from rollers 548 and 550 by spark gaps 540 as illustrated.

Similar to assembly 400, rollers 548 and 550 rotate about rollers 542, 544 and 546 through rotation of disks 470 and 472. Assembly 500 also includes an air knife similar to assembly 400 but is not illustrated herein.

Referring now to FIGS. 13-14, another embodiment of a roller spark gap is illustrated as assembly 600. Assembly 600 includes rollers 642, 644, 646 and 648 mounted on shafts 602, 604, 606, and 608 with bearings 610. Rollers 642 and 644 and rollers 646 and 648 are separated from each other by roller gap 640.

Assembly 600 also includes blade electrodes 682, 684 and 686. Each of blade electrodes 682, 684 and 686 includes tip 688. Blade electrodes 682 and 686 may be connected to an electric circuit to couple assembly 600 to a source of electrical power controlled by apparatus 600. Blade electrode 682 is located proximate to and substantially parallel to roller 642 and is separated from roller 642 by blade gap 670. Blade electrode 684 is located proximate to and substantially parallel to rollers 644 and 646 and is separated from rollers 644 and 646 by blade gap 670. Blade electrode 686 is located proximate to and substantially parallel to roller 648 and is separated from roller 648 by blade gap 670.

Blade gap 670 is at least equal to or less than roller gap 640. In one embodiment blade gap 670 is between approximately 0.001 and 0.005 of an inch.

Tip 688 of blade electrodes 682, 684 and 686 may be a sharp edge. In the illustrated embodiment, a tip 688 is a single beveled edge. Other embodiments could use a double beveled edge, a rounded edge or a squared edge, by way of example and as described below with regard to FIG. 13*a*.

While not specifically illustrated, blade electrodes 682, 684 and 686 may be configured to be readily removable from assembly 600.

Referring now to FIG. 13*a* several alternate embodiments of tip 688 of blade electrodes 682, 684 and 686 are illustrated. Some embodiments include detachable blade edge 690 or 691. Blade edge 690 includes a squared edge while blade edge 691 includes a single beveled edge. In one embodiment, detachable blade edge 690 or 691 may be constructed from tungsten or other erosion resistant material while the remaining portions of blade electrodes 682, 684 and 686 may be constructed of another electrically conductive material, for example, brass.

FIG. 13*a* also depicts a rounded blade edge geometry as tip 692 and a square blade edge geometry as tip 693. The illustrated blade edge and tip geometries are provided by way of example. Other geometries can be used as appropriate.

In various embodiments, the roller spark gaps described herein can operate between approximately 50 and 500 gap-firings per second, depending on the circuit controlled. It is possible to use the roller spark gaps described herein for other firing rates, including faster than 500 gap-firings per second and slower than 50 gap-firings per second. To maintain a given power throughput, lower firing rates require higher voltage while higher firing rates require lower voltage. The operating parameters of various embodiments of system 100 dictate the stated gap-firing rate range of 50 to 500 gap-firings per second. This gap-firing rate range does not represent a performance limitation of the disclosed roller spark gaps.

Similarly, in various embodiments, the roller spark gaps described herein are described as controlling between 8 and 12 kW of substantially continuous power throughput. Once again, this power throughput range is dictated by various embodiments of system 100 and do not represent a performance limitation of the disclosed roller spark gap. Lower energy throughput could be handled by the disclosed system and higher energy throughput is achievable, although some modifications may be required such as longer or larger rollers and/or increased airflow.

The outer surface of rollers 242, 244, 342, 344, 346, 348, 442, 444, 446, 542, 544, 546, 548, 550, 642, 644, 646 and 648 may be constructed of several materials. In one embodiment, pure tungsten or tungsten alloy may be utilized. In other embodiments, brass may be used. Other electrically conducted materials may be fabricated from brass or copper or other suitably conductive material wherein the non-conductive components are constructed of phenolic in one embodiment. Other embodiments may utilize other heat and discharge resistant materials as desired.

Air knives 250, 350 and 450 described above can utilize various airflow profiles, as desired. In some embodiments, air knives 250, 350 and 450 provide a substantially consistent airflow where the airflow velocity and volume are substantially the same along the length of air knives 250, 350 and 450. In other embodiments, air knives 250, 350 and 450 can provide a variable airflow. For example, airflow velocity and volume could be highest at either end of air knives 250, 350 and 450 with the lowest airflow velocity and volume near the middle of air knives 250, 350 and 450. Airflow velocity and volume at a particular part of air knives 250, 350 and 450 can be controlled by various means known in the art, including, but not limited to, the width of the gap in the air knife, the relative length of the gap in the air knife, and internal baffling in air knives 250, 350 and 450 controlling relative flow rates.

While the roller spark gaps described above include air knives, other types of dielectric gas can be used to quench and/or cool a roller spark gap. In this regard, the terms air knife and gas knife are synonymous. In addition, other forms of quenching and/or cooling can be utilized with the disclosed roller spark gaps including, but not limited to magnetic quenching. Similarly, while the roller spark gaps described herein are self triggered by reaching sufficient voltage potential between the rollers, other trigger methods can be used with roller spark gaps, including, but not limited to, laser triggering, UV irradiation, over-voltage pulses and/or varying the pressure of the dielectric gas.

The roller spark gaps described above are optimized for continuous operation. The definition of continuous operation is variable and depends upon the characteristics of the current being switched by roller spark gap. In one embodiment, continuous operation for several seconds is continuous operation. In another embodiment, continuous operation for several minutes is considered continuous operation. In yet another embodiment, continuous operation for several hours is considered continuous operation. In yet another embodiment, continuous operation for several days is considered continuous operation.

While the disclosure has been illustrated and described in detail in the drawings and foregoing description, the same is to be considered as illustrative and not restrictive in character, it being understood that only the preferred embodiments have been shown and described and that all changes and modifications that come within the spirit of the disclosure are desired to be protected.

What is claimed is:

1. A system for switching high voltage and high power current comprising:

a first electrode;

a first roller substantially parallel to said first electrode and spaced apart from said first electrode by a spark gap, wherein said first roller and said first electrode are electrically isolated from each other;

a gas knife outputting a dielectric gas, wherein said dielectric gas output is directed through said spark gap;

a power source providing substantially continuous power output exceeding eight kilowatts at a source voltage;

wherein said first roller, said first electrode and said power source are constructed and arranged to substantially fully transmit said power output through said spark gap by repeated electric discharges through said dielectric gas across said spark gap.

2. The system of claim 1, wherein the breakdown voltage of said spark gap in said dielectric gas is less than said source voltage.

3. The system of claim 1, wherein said first roller is non-concentric about its axis of revolution.

4. The system of claim 1, wherein said first roller is substantially concentric about its axis of revolution.

5. The system of claim 1, wherein said power source provides substantially continuous power output between ten and twelve kilowatts.

6. The system of claim 1, further comprising a first drive system constructed and arranged to rotate said first roller about its axis of revolution.

7. The system of claim 1, wherein the root mean square of said source voltage exceeds ten thousand volts.

8. The system of claim 1, further comprising a blade electrode substantially parallel to said first roller and spaced apart from said first roller by a blade gap, wherein said blade electrode and said first roller are electrically isolated from each other, wherein said blade gap does not exceed said spark gap and wherein said power output is substantially fully transmitted through said blade gap by repeated electric discharges through said dielectric gas across said blade gap.

9. The system of claims 8, wherein said blade electrode comprises a body and a detachable blade edge.

10. The system of claim 9, wherein said body and said detachable blade edge are made of different materials.

11. The system of claim 1, wherein said first electrode comprises a second roller.

12. The system of claim 11, further comprising a first drive system constructed and arranged to rotate said first and second rollers about their axis of revolution.

13. The system of claim 1, further comprising a rotational support that permits the revolution of said first roller about said first electrode, wherein said first electrode comprises a second and third roller separated by an insulator that electrically isolates said second and third rollers from each other.

14. The system of claim 1, wherein the system substantially continuously transmitted said power output for between approximately 10 seconds to 80 hours.

15. The system of claim 1, wherein the system pulses said power output at least fifty times a second.

16. The system of claim 1, wherein the system pulses said power output between approximately fifty and five hundred times a second.

17. The system of claim 1, further comprising a passage inside said first roller and a source of pressurized cooling gas coupled to said passage.

18. The system of claim 1, further comprising a capacitor electrically coupled to said power source, wherein said capacitor accumulates a charge from said power source and wherein said charge is substantially fully transmitted through said spark gap when electricity discharged through said dielectric gas across said spark gap.

19. The system of claim 1, further comprising a load having a high voltage and a high current requirement, wherein said spark gap electrically couples said load to said power source.

20. The system of claim 1, further comprising a ground path electrically coupled to said first electrode.

21. The system of claim 1, wherein an outer surface of said first roller is constructed of tungsten.

22. The system of claim 1, wherein the first roller further comprises a cylindrical body with an outer diameter and a roller width greater than the outer diameter, wherein the first electrode further comprises an electrode width at least equal to the roller width, wherein the roller width is defined along the portion of the first roller substantially parallel to the first electrode and wherein the electrode width is defined along the portion of the first electrode substantially parallel to the first roller.

23. A method of switching electrical current, the method comprising:

electrically coupling a power source to a first electrode, wherein the power source provides power output exceeding eight kilowatts and wherein the power source has an electrical potential;

electrically coupling a load to a first roller arranged substantially parallel to the first electrode and spaced apart from the first electrode by a spark gap filled with a dielectric gas, wherein the first roller and first electrode are electrically isolated from each other and wherein the spark gap defines a breakdown voltage in the dielectric gas less than the electrical potential;

rotating the first roller about its axis of revolution; and blowing the dielectric gas from a gas knife through the spark gap, wherein the electrical potential in the power source is transmitted to the load via an electrical discharge across the spark gap and wherein the power output is substantially fully transmitted to the load.

24. The method of claim 23, wherein the first roller has a non-concentric axis of revolution.

25. The method of claim 23, wherein the power source provides output power between ten and twelve kilowatts.

26. The method of claim 23, further comprising:

rotating the first roller about its axis of revolution with a first drive system.

27. The method of claim 23, further comprising:

electrically coupling the load to a blade electrode substantially parallel to the first roller and spaced apart from the first roller by a blade gap, wherein the blade electrode and the first roller are electrically isolated from each other and wherein the blade gap does not exceed the spark gap.

28. The method of claim 23, further comprising revolving the first roller about the first electrode, wherein the first roller and the first electrode are coupled to a rotational support that permits the first roller to revolve about the first electrode and wherein the first electrode comprises a second and third roller separated by an insulator that electrically isolates the second and third roller from each other.

29. A system for switching an electric current comprising:

a first roller spark gap comprising: a first electrode and a first roller substantially parallel to said first electrode and spaced apart from said first electrode by a first spark gap, wherein said first roller and first electrode are electrically isolated from each other;

a second roller spark gap comprising: a second electrode and a second roller substantially parallel to said second electrode and spaced apart from said second electrode by a second spark gap, wherein said second roller and second electrode are electrically isolated from each other;

a power source providing a substantially continuous power output at a source voltage;

wherein said first roller spark gap, said second roller spark gap and said power source are constructed and arranged to substantially fully transmit said power output through said first and second roller spark gaps arranged in series by repeated electric discharges across said first and second spark gaps.

30. The system of claim 29, further comprising:

a first gas knife outputting a dielectric gas, wherein said dielectric gas output is directed through said first spark gap;

a second gas knife outputting said dielectric gas directed through said second spark gap.

31. The system of claim 29, wherein said first and second rollers are non-concentric about their axes of revolution.

32. The system of claim 29, further comprising a first blade electrode substantially parallel to said first roller and spaced apart from said first roller by a first blade gap and a second blade electrode substantially parallel to said second roller and spaced apart from said second roller by a second blade gap, wherein said first and second blade gaps do not exceed said first and second spark gaps and wherein said power output is substantially fully transmitted through said first and second blade gaps by repeated electric discharges across said first and second blade gaps.

* * * * *